United States Patent

Luk

[19]

[11] Patent Number: 6,055,661
[45] Date of Patent: Apr. 25, 2000

[54] SYSTEM CONFIGURATION AND METHODS FOR ON-THE-FLY TESTING OF INTEGRATED CIRCUITS

[76] Inventor: Fong Luk, 2926 Lambeth Ct., San Jose, Calif. 95132

[21] Appl. No.: 08/591,225

[22] Filed: Jan. 18, 1996

Related U.S. Application Data

[63] Continuation of application No. 08/259,011, Jun. 13, 1994, abandoned.

[51] Int. Cl.[7] .................................................. G01R 31/28
[52] U.S. Cl. .......................................................... 714/736
[58] Field of Search .................................. 714/736, 739, 714/724; 371/25.1, 27.2

[56] References Cited

U.S. PATENT DOCUMENTS

| | | | |
|---|---|---|---|
| 3,614,608 | 10/1971 | Giedd | 371/25.1 |
| 3,651,315 | 3/1972 | Collins | 714/736 |
| 3,657,527 | 4/1972 | Kassabgi et al. | 371/25.1 |
| 3,688,099 | 8/1972 | Buscher | 371/25.1 |
| 3,740,645 | 6/1973 | Cook | 371/25.1 |
| 3,812,426 | 5/1974 | Illian | 371/25.1 |
| 3,821,645 | 6/1974 | Vinsani | 371/25.1 |
| 3,826,909 | 7/1974 | Ivashin | 371/25.1 |
| 3,892,955 | 7/1975 | Maejima | 371/25.1 |
| 4,183,459 | 1/1980 | Don et al. | 371/25.1 |
| 4,523,312 | 6/1985 | Takeuchi et al. | 714/700 |
| 4,771,428 | 9/1988 | Acuff et al. | 714/736 |
| 4,791,357 | 12/1988 | Hyduke | 371/25.1 |
| 4,801,870 | 1/1989 | Eichelberger et al. | 714/736 |
| 4,837,765 | 6/1989 | Suzuki | 714/736 |
| 4,893,072 | 1/1990 | Matsumoto | 714/731 |
| 4,907,230 | 3/1990 | Heller et al. | 714/724 |
| 4,961,053 | 10/1990 | Krug | 324/537 |
| 5,177,440 | 1/1993 | Walker, III et al. | 714/736 |
| 5,243,274 | 9/1993 | Kelsey et al. | 714/724 |
| 5,325,309 | 6/1994 | Halaviati et al. | 364/488 |
| 5,392,298 | 2/1995 | Shinjo | 714/736 |

OTHER PUBLICATIONS

Vasquez et al. Known–Good–Die Technologies on the Horizon, IEEE, pp. 356–359, 1994.

Dislis et al., Economics modelling for the determination of optimal known good die strategis, IEEE, pp. 8–13, 1994.

*Primary Examiner*—Albert De Cady
*Assistant Examiner*—Shelly A Chase
*Attorney, Agent, or Firm*—Bo-In Lin

[57] ABSTRACT

An integrated circuit (IC) testing system is provided by the present invention. The IC testing system is for testing a device under test (DUT) IC. The IC testing system includes an interface to a target system. The target system incorporates a known good IC (KGIC) which is identical to the DUT. The KGIC is implemented on the target system as it is designed to be used during the normal operation of the target system. The target system will then exercise the KGIC by running the diagnostic programs or by sending appropriate instructions or commands to invoke the KGIC to perform different functions for the target system. The interface system provided by the present invention for performing an IC test will then capture the signals to and from the KGIC on-the-fly. The testing system of the present invention will redirect the KGIC input signals to the DUT as testing input signals, i.e., input stimuli. The output signals generated by the will be used as the reference signals for comparison with the corresponding response signals from the DUT for fault detection.

12 Claims, 6 Drawing Sheets

SYSTEM CONFIGURATION AND METHODS FOR ON-THE-FLY TESTING OF INTEGRATED CIRCUITS

This is a continuation of 08/259,011 filed Jun. 13, 1994 now abandoned.

BACKGROUND OF THE INVENTION

1. Field of the Invention

This invention relates generally to the method and system of testing the integrated circuits (ICs). More particularly, this invention relates to a high speed real time testing by employing a new testing technique which utilizes a different testing configuration such that the requirements that the testing stimuli must first be generated or stored for input as a sequence of testing patterns or testing vectors may be eliminated.

2. Description of the Prior Art

As the integrated circuits (ICs) become more complicate with higher level of integration and increasingly faster operational speed, the traditional technique of IC testing by pre-storing in high speed memory a plurality of 'test pattern signals' and then supplying these pattern signals through different drivers to corresponding terminal pins at different times becomes too expensive and complicate to be practically useful. Specifically, these type of testing techniques often can not achieve the necessary 'fault coverage' as increasingly more functions are being integrated into a single IC. High speed IC testing with high pin count, particularly for the application specific ICs (ASICs), usually requires testing equipments cost millions of dollars and consumes many man-months of testing engineers' efforts for each specific design. These highly sophisticate testing equipments and long-hours of engineering efforts are required because of the needs to (1) generate large amount of 'test pattern signals', or often referred to as 'test vectors' or 'input stimulus', for each input pin, (2) perform an 'off-line' simulation analysis with the test pattern signals as input to calculate a plurality of 'predicted output signals' from each of output pins and stored the predicted output signals in the memory of the tester, (3) control the timing and sequence for transmitting and inputting each of these test vectors to each input pin, (4) collect a plurality of output signals from each output pin at exact timing, and (5) compare each of the output signals with the predicted 'correct' output signal at exact time and sequence to determine if the device under test (DUT) performs each tested function according to the design.

As the ICs now include more input, output and input/output (I/O) pins and operating at higher speed, testing of these ICs becomes even more complex and expensive. A very complicate simulation program has to be developed to model the high speed functioning of the circuits embodied in the DUT. Large amount of input data and simulated output data have to be generated and stored as the 'test pattern signals' for each input pin and 'predicted output signals' for each output pin. The test pattern signals are to be controlled for transmitting and then inputting to each input pin at exact time and sequence at high speed. Meanwhile, the output signals from each output pin are to be collected, stored or processed, also at very high speed to complete the test functions. Tremendous resources, including man-power, expenditures for testing equipments, and testing software developments are demanded by such a testing operation.

Many different techniques are disclosed in prior U.S. patents in attempt to reduce the costs and efforts, or to improve the performance levels of the IC testing operations. Takeuchi discloses in U.S. Pat. No. 4,523,312 (issued on Jun. 11, 1985) a test configuration wherein a plurality of low pass filters are used to improve the 'rise and fall characteristics' of the test pattern signals. The errors which may be introduced due to grounding capacities of connector lines and the IC socket may be reduced by the use of the low pass filters as disclosed by Takeuchi. In another U.S. Pat. No. 4,771,428 (issued on Sep. 13, 1988), Acuff et al. discloses a testing computer which stores a plurality of test vectors representing stimulus signals for applying to circuit. The testing computer also stored a plurality of data representing the responsive data to be sensed from the circuit The stored test vectors are then applied through a driver associated with each input of the circuit to be tested. The driver can generate an output signal which can be either a high or low state in response to the input stimulus signals and a floating state in response to data representing the response signals. Response signals from the device to be tested are compared to the data representing response signals to determine the occurrence of a fault.

Eichelberger et al. disclose in U.S. Pat. No. 4,801,870 a method for testing a very large scale integrated circuit (VLSI), particularly, the Level Sensitive Scan Design (LSSD) devices, by applying in parallel differently configured sequences of pseudo-random patterns to each of the input terminals of the device under test. The output response data are then collected from each of the output terminals in parallel and combined into a 'signature'. The collected signatures are then compared with predicted signatures generated from a computer simulation analysis. The input stimulus signals are then altered in a predetermined fashion as a function of the structure of the DUT by applying different weights to the input signals for input to each input terminals. The above testing techniques as disclosed by Takeuchi, Acuff et al., and Eichelberger et al. are useful in either improving the accuracy of the test operation or to provide better methods to detect device failures. However, the basic mode of operation, i.e., to first generate, store, and apply testing vectors to the DUT and then compare the responses with predicted simulation results for fault detection, does not provide a solution to the difficulty currently faced by the art of IC testing. This method is too time consuming, expensive and complicate for application to the modern IC designs. With the number of pins, the faster speed and the level of integration in combining so many functions in a single IC, this traditional method of testing is not suitable to achieve the goal of functionality test in an economical and effective manner.

Several more recent U.S. patents apply the same basic testing technique and similar system configuration with (1) improvements over the control of the input signal timing, i.e., U.S. Pat. No. 4,893,072 by Matsumoto, (2) reduction of expenditure in testing by including 'testing component' as part of the circuits on an IC, i.e., U.S. Pat. No. 4,961,053 by Krug, (3) increasing the test speed by providing high speed clock signals, i.e., U.S. Pat. No. 5,177,440 by Walker, III et al., (4) lower the cost for testing the ASICs by providing dedicated ASIC tester with its own microprocessor and random access memory (RAM) for storing the testing vectors and predicted responses, i.e., U.S. Pat. No. 5,243,274 by Kelsey et al., and (5) applying personal computer (PC) workstation to remotely control the generation of the stimulus and collection of the responses by the use of four-channel Test Access Port All these techniques can achieve to a certain extent a higher speed or accuracy, cost reduction, or convenience and efficiency of the testing operations.

However, in this conventional approach, due to the heavy burden in requiring the very complex processes of controlling the generation, storing, inputting and processing tremendous amount of input data, i.e., testing pattern signals, and output data, i.e, the response signals, the IC functional tests remain to be one of the most expensive, time consuming and difficult tasks.

Therefore, there is still a demand in the art of IC testing for a new technique and system configuration which can simplify the IC testing processes thus minimizing the requirements for expensive testing equipments, the long-hours of engineers' efforts for testing pattern generating and output signal simulation, the memory required for the storage of the testing input and output data, and the highly sophisticated control of exact timing in transmitting and collecting of these data.

SUMMARY OF THE PRESENT INVENTION

It is therefore an object of the present invention to provide a new IC testing technique and system configuration to overcome the aforementioned difficulties encountered in the prior art.

Specifically, it is an object of the present invention to provide a new IC testing technique and system configuration wherein generation of testing pattern signals are greatly simplified and storage of the testing pattern signals are no longer required for conducting the IC functionality tests.

Another object of the present invention is to provide a new IC testing technique and system configuration wherein high speed IC functionality tests can be performed with simple system configuration so that the tests can be economically performed with very simple and low cost test equipments.

Another object of the present invention is to provide a new IC testing technique and system configuration wherein the processes used for controlling the exact timing in inputting testing pattern signals and collecting necessary response signals for comparisons and fault detection can be greatly simplified.

Another object of the present invention is to provide a new IC testing technique and system configuration wherein the IC functionality tests can be very flexibly arranged without being limited by different types of simulation analyses required in the conventional testing methods.

Another object of the present invention is to provide a new IC testing technique and system configuration wherein more extensive tests on an IC with billions of test vectors can be performed without being limited by the conventional testing systems where the number of test vectors is restricted by the storage capacity of the test equipments and is often limited to few millions of test vectors.

An integrated circuit (IC) testing system is provided by the present invention. The IC testing system is for testing a device under test (DUT) IC. The IC testing system includes an interface to a target system. The target system incorporates a known good IC (KGIC)which is identical to the DUT. The KGIC is implemented on the target system as it is designed to be used during the normal operation of the target system. The target system will then exercise the KGIC by running the diagnostic programs or by sending appropriate instructions or commands to invoke the KGIC to perform different functions for the target system. The interface system provided by the present invention for performing an IC test will then capture the signals to and from the KGIC on-the-fly. The testing system of the present invention will redirect the KGIC input signals to the DUT as testing input signals, i.e., input stimuli. The output signals generated by the will be used as the reference signals for comparison with the corresponding response signals from the DUT for fault detection.

Briefly, in a preferred embodiment, the present invention comprises an IC testing system. The integrated circuit (IC) testing system is for testing a device under test (DUT) IC. The IC testing system includes an interface to a target system capable of executing a program therein for generating a plurality of input signals to a known-good IC (KGIC) which is identical to the DUT IC wherein the KGIC being responsive to the input signals is capable of generating a plurality of known-good output signals. The testing system further includes an input signal transmitting means, e.g., the input signal lines for transmitting the input signals to the DUT IC for generating a plurality of test output signals. The testing system further includes an output signal processing means, e.g., an output signal comparison means , for receiving and processing the known-good output signals and the test output signals for determining testing results therefrom.

It is an advantage of the present invention is that it provides a new IC testing technique and system configuration wherein generation of testing pattern signals are greatly simplified and storage of the testing pattern signals are no longer required for conducting the IC functionality tests.

Another advantage of the present invention is that it provides a new IC testing technique and system configuration wherein high speed IC functionality tests can be performed with simple system configuration so that the tests can be economically performed with very simple and low cost test equipments.

Another advantage of the present invention is that it provides a new IC testing technique and system configuration wherein the processes used. for controlling the exact timing in inputting testing pattern signals and collecting necessary response signals for comparisons and fault detection can be greatly simplified.

Another advantage of the present invention is that it provides a new IC testing technique and system configuration wherein the IC functionality tests can be very flexibly arranged without being limited by different types of simulation analyses required in the-conventional testing methods.

Another advantage of the present invention is that it provides a new IC testing technique and system configuration wherein more extensive tests on an IC with billions of test vectors can be performed without being limited by the conventional testing systems where the number of test vectors is restricted by the storage capacity of the test equipments and is often limited to few millions of test vectors.

These and other objects and advantages of the present invention will no doubt become obvious to those of ordinary sdill in the art after having read the following detailed description of the preferred embodiment which is illustrated in the various drawing figures.

DETAILED DESCRIPTION OF THE PREFERRED EMBODIMENT

Figure 1:
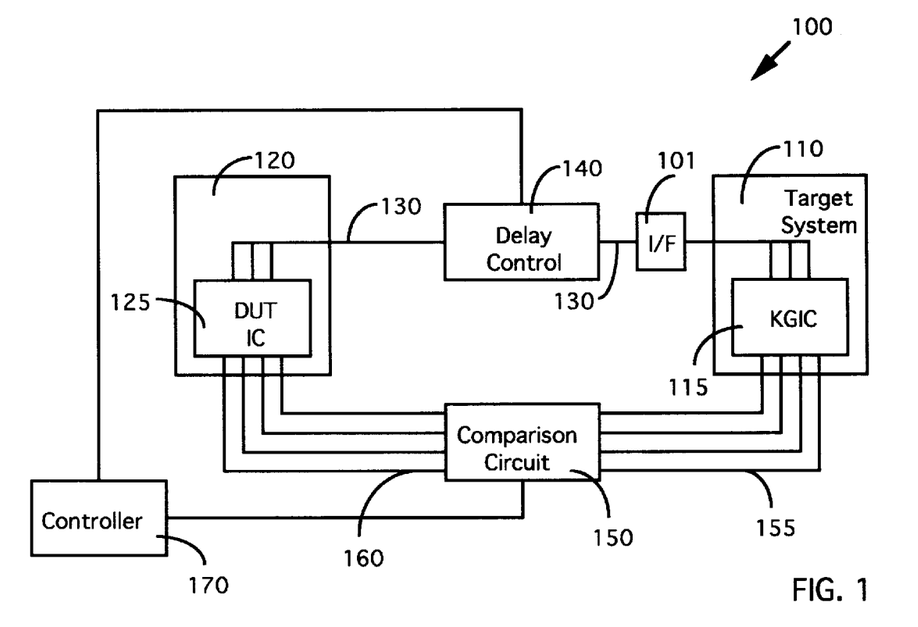
FIG. 1 is a functional block diagram showing the system configuration of an IC testing system according to the present invention.

FIG. 1 is a functional block diagram of an IC testing system 100 according to the present invention. The testing system 100 includes an interface 101 to a target system 110 and a tester 120 which contains a device under test (DUT) IC 125 therein. The target system 110 is preferably a type of system that the DUT IC 125 is targeted to be implemented eventually. The target system 110 incorporated a 'known-good' IC (KGIC) 115 which is identical to the DUT IC 125 to be tested. The known-good IC is installed on the target system exactly the same way as the DUT IC 125 to be installed thereon. The testing system 100 also includes a plurality of input signal lines 130. One end for each of these input signal lines 130 is connected to a an input pin of the known-good IC and the other end of each of these input signal lines is connected to a correspondent input pin of the DUT IC 125. These input signals lines are also connected to and buffered and controlled by an input delay control device 140. The testing system 100 also includes an output signal comparison means 150 with a plurality of output signal lines 155 connected to a plurality of output pins of the known-good IC 115 and a second set of output signal lines 160 connected to a set of corresponding output pins on the DUT IC 125.

In order to perform an test on the DUT IC 125, the target system 110 is initiated and begin to operate by either executing a set of predetermined programs or issuing a sequence of commands or instructions. In executing these programs or issuing instructions, the input pins of the known-good IC (KGIC) 115 receive a plurality of input signals. these input signals are also captured, buffered and transmitted, under the control of the delay device 140, to each of the corresponding pins on the DUT IC 125 via the input signal lines 130. The input signals transmitted through the input signal lines 130 to the DUT IC are used as stimuli signals for testing the DUT IC 125. A plurality of test output signals from the DUT IC 125 from the DUT output pins in response to these input signals The test output signals generated from the DUT IC 125 are transmitted via the second set of output signals lines 160 to the comparison means 150. In the mean time, the KGIC 115 also generates a corresponding set of output signals from its output pins. The output signals from the KGIC 115 are also transmitted to the comparison means 150 via the first set of output signal lines 155. The output signal comparison means 150 then administrates an appropriate time delay to the output signals received form the DUT IC 125 according to the delay of the input signals administrated by the delay control device 140 and perform a comparison on two corresponding output signals. A fault detection signal is generated and and a faultprocessing sequence is invoked when the output signal comparison means 150 detects a difference between the signals received from the DUT IC 125 and the KGIC 115.

In fact the 'on-the-fly' test concept implemented in the IC testing system 100 can be applied to the testing of other kinds of devices as well. In summary, FIG. 1 shows an on-the-fly testing system for testing a device under test (DUT) by employing a known-good-device (KGD) which is identical to the DUT. The DUT device can be mechanical, chemical, electrical or other kinds of devices. The testing system includes an interface to a target system capable of incorporating the KGD therein for intended operation thereon for generating a plurality of target system input signals to the KGD. The KGD is responsive to the input signals and is capable of generating a plurality of known-good output signals. The testing system further includes an input signal transmitting means for transmitting the plurality of target system input signals to the DUT for generating a plurality of test output signals. The testing system further includes an output signal processing means for receiving and processing the known-good output signals and the test output signals for determining testing results therefrom. In a preferred embodiment, the testing system further includes a control means for controlling the timing of the input signals, the known-good output signals, and the test output signals.

A specific example of such a testing systems is an IC testing system 100 for testing a device under test (DUT) IC 125. The IC testing system comprises an interface 101 to a target system 110 which is capable of incorporating a known-good IC (KGIC) 115 therein for intended operation thereon for generating a plurality of input signals to the known-good IC (KGIC) 115 which is identical to the DUT IC 125 wherein the KGIC 115 being responsive to the input signals is capable of generating a plurality of known-good output signals. The testing system 100 further includes an input signal transmitting means, e.g., the input signal lines 130 for transmitting the input signals to the DUT IC 125 for generating a plurality of test output signals. The testing system 100 further includes an output signal processing means, e.g., an output signal comparison means 150, for receiving and processing the known-good output signals and the test output signals for determining testing results therefrom. In a preferred embodiment, the testing system may further include a control means 170 for controlling the timing of the input signals, the known-good output signals, and the test output signals. The control means 170 may be connected to the input signal delay control device 140 and the output signal comparison means 150 for performing the control functions. In another preferred embodiment, the output signal processing means 150 may further include an output signal delay-time adjusting means for adjusting the delay time of the test output signals to coincide with the known-good output signals. In yet another preferred embodiment, the input data transmitting means 130 may further include a transmitting-time control means 140 for controlling the timing of transmitting the input data to the DUT IC 125.

Figure 2:
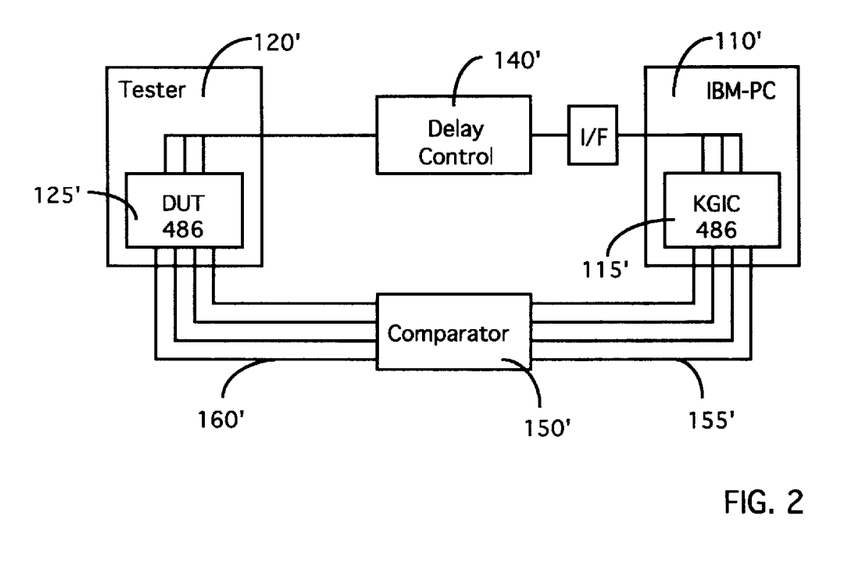
FIG. 2 is a functional block diagram for an alternate preferred embodiment of an IC test system of the present invention.

FIG. 2 shows one of the preferred embodiments for the present invention, i.e., a testing system 100', wherein the DUT IC 125" is an Intel-486 central processor unit (CPU) processor and the target system 110' is an IBM compatible personal computer (PC) which is the type of personal computer that the DUT IC 125', i.e., the Intel-486 microprocessor is targeted to be implemented. The target system 110' incorporates a known-good IC, i.e., a known-good Intel 486 installed therein. In order to perform the IC tests, the target system 110' is invoked to execute a sequence of 'self-diagnostic' programs. These self-diagnostic programs enable the personal computer, i.e., the target system 110' to perform a plurality of diagnostic checks on the KGIC, i.e., the Intel-486 installed in the personal computer 110, to assure that the known-good IC can indeed perform all the functions according to the design specification.

In the meantime, the input signals to the KGIC 115', i.e., the Intel-486 under the self-diagnostic test on the target system 110 are also inputted to the corresponding input pins of the DUT IC 125', i.e., the Intel-486 under test in the tester 120'. The input delay control device 140 controls and adds a specific delays to the input signals from the KGIC 115' and transmitting these signals to the DUT IC 125'. A sequence of output signals generated from the KGIC 115' and the DUT IC 125' are then received by the output signal comparison means 150 to perform the comparison and fault detection operations. By running the self-diagnostic programs on the KGIC 115 and by introducing the input signals for the KGIC 115 to the corresponding input pins of the DUT IC 125', the testing operation as described above is able to diagnose the KGIC 115' and test the DUT IC in parallel to assure the test results obtained from the testing system 100' are more reliable.

Figure 3:
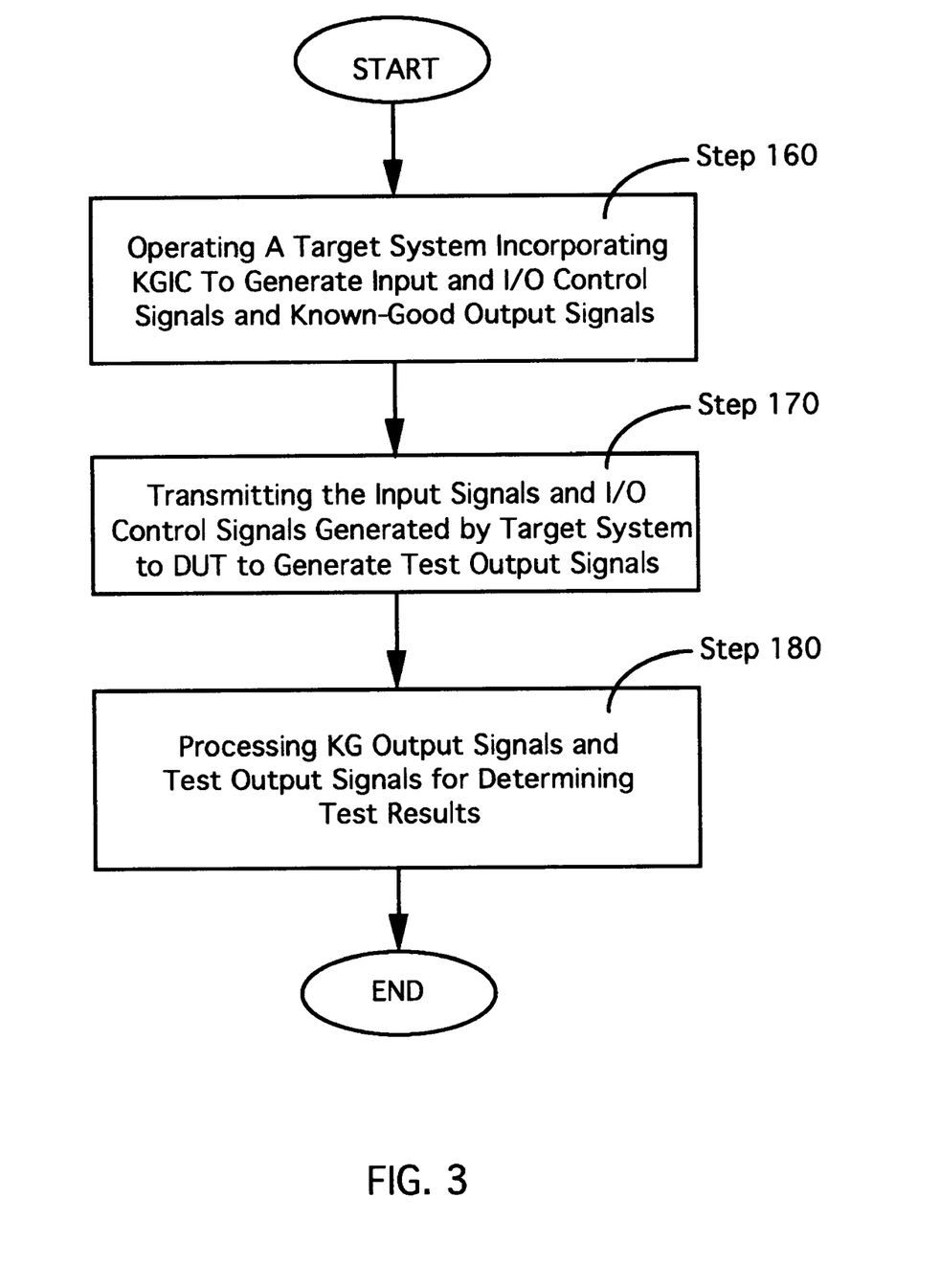
FIG. 3 is a flow chart showing the steps taken by an IC testing system of FIG. 1 for performing an IC test.

FIG. 3 is a flow chart showing the steps employed by a method for testing a device-under-test (DUT) integrated circuit (IC) as disclosed in the present invention which comprises the steps of: (a) operating a target system 110 incorporating a known-good IC (KGIC) 115 which is identical to the DUT IC 125 for generating and inputting a plurality of input signals to the KGIC 115 and generating a plurality of known-good output signals in response to the input signals and I/O signals if the KGIC 115 has I/O pins (step 160); (b) transmitting the input signals and I/O control signals, if the KGIC has I/O pins, for inputting to the DUT IC 125 for generating a plurality of test output signals (step 170); and (c) receiving and processing the known-good output signals and the test output signals for determining test results therefrom (step 180).

Figure 4:
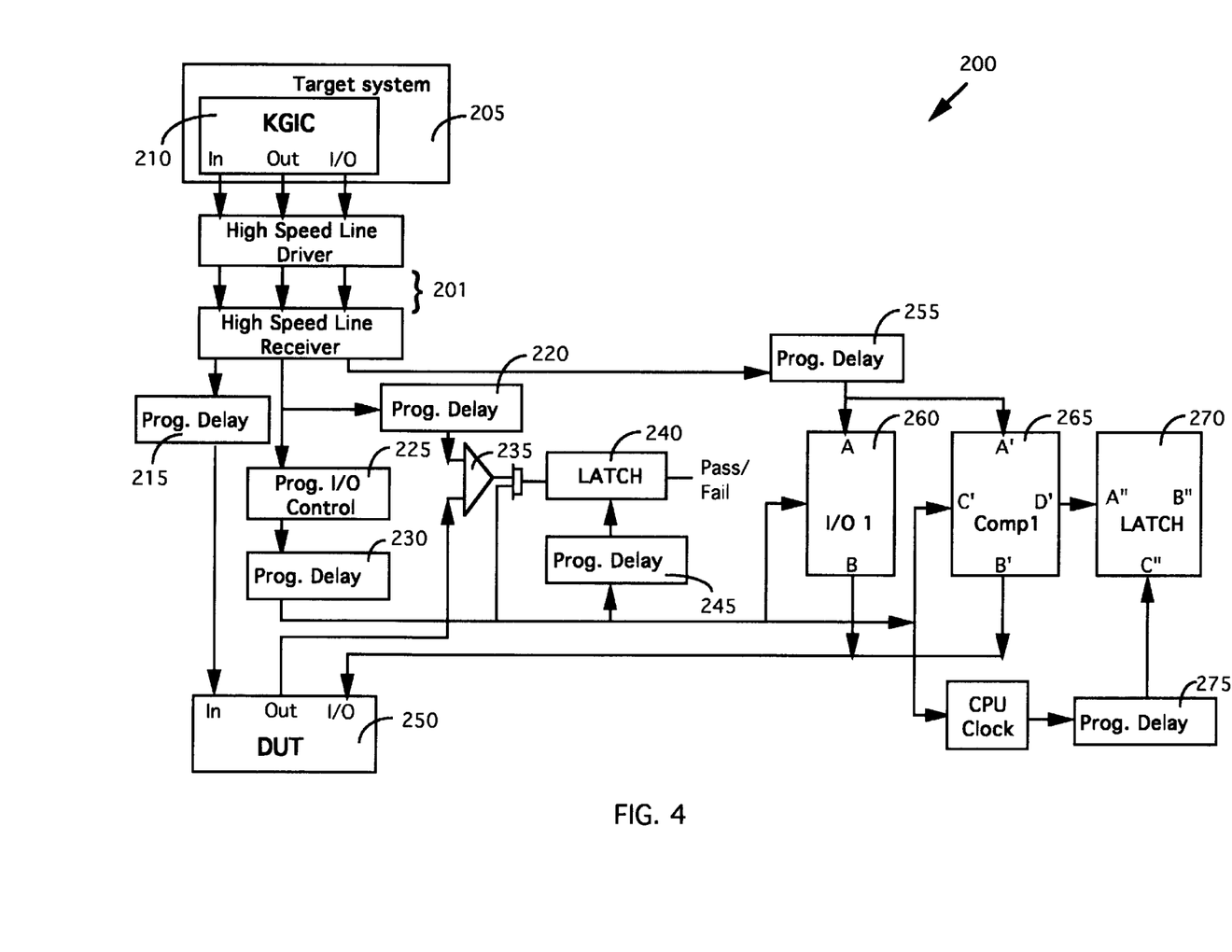
FIG. 4 is a functional block diagram of another preferred embodiment of an IC test system for testing a DUT IC with input, output and input/output pins according to the present invention.

FIG. 4 shows another preferred embodiment of the present invention wherein an integrated circuit (IC) testing system 200 is applied for testing a device under test (DUT) IC 250. The IC testing system 200 includes a target system interface means 201 which includes high speed drivers, receivers and transmission lines for connecting to all input, output and I/O pins of a KGIC 210. The KGIC 210 is incorporated and operational on a target system 205. The KGIC 210 is identical to the DUT 250 wherein both have a set of input pins, i.e., IN, a set of output pins, i.e., OUT, and a set of input/output pins, I/O. The signal lines of the target system interface means 201 connecting to the input pins of KGIC 210 are connected to the input pins of the DUT 250 through a first programmable delay means 215. The signal lines connected to the output pins of KGIC 210 are connected via a second programmable delay means 220 to a comparator 235. Meanwhile, the output pins of the DUT 250 are also connected to the comparator 235 wherein the output signals from the output pins of the KGIC 210 are compared with that of the DUT 250. The first and the second programmable delay means 215 and 220 are used to adjust the timing of signals transmitted from the KGIC 210 such that the output signals from the output pins from the KGIC 210 and the DUT 250 can be synchronized to arrive the comparator 235 with a desired timing relationship. The comparator 235 is connected to a latch 240 controlled by a third programmable time delay 245. The result of the comparisons made by the comparator 235 are latched into the latch 240 with a programmable time tolerance ATtolerance generated by the third programmable time delay 245 for allowing the time tolerance caused by the timing differences between the the output signals generated from the output pins of either the KGIC 210 or the DUT 250. A pass/fail signal is generated from the latch 240 depending on the result of the comparison made by the comparator 235.

The I/O pins of the KGIC 210 and the DUT 250 can either receive input signals or generate output signals. The output signals from specific output pins on the KGIC 210 and DUT 250 will provide an indication for each machine cycle whether the I/O pins on the KGIC 210 and DUT 250 are to receive input signals or to generate output signals. The output signals from the output pins of the KGIC 210 are also received by a programmable I/O control module which can be programmed to provide an input or output (I/O) indication for different chip designs. The I/O indication generated by the programmable I/O module 225 is then transmitted to an I/O switching means 260 via a fourth programmable delay means 230 for delay time adjustment. The I/O switching means 260 has an input terminal C to receive the I/O indication and another input terminal A to receive the input signals, via a fifth programmable time delay means 255, from the I/O pins of the KGIC 210. The I/O switching means 260 has an output signal B. When the I/O indication received on the input terminal C is an input indication, i.e., when the signal received by C is zero, the I/O switching means 260 connects the input terminal A to the output terminal B whereby the input signals received by the I/O pins on the KGIC 210 are also inputted to the I/O pins on the DUT 250. When the I/O indication received by the input terminal C is an output indication, i.e., when the signal received by C is one, the input terminal A is disconnected from the output terminal B.

The output signals generated from the fifth programmable delay means 255 are also inputted to an input terminals A' of a comparator 265 which has two other input terminals B' and C' and an output terminal D'. On the comparator 265, the input terminal C' receives the I/O indication and the input terminal B' receives the output signals from the I/O pins of the DUT 250. When the input signal received by the input terminal C' is zero, i.e., the I/O pins of the KGIC 210 and DUT are to receive input signals, the output signals from the output terminal D' is set to zero. When the input signal received by the input terminal C' is one, i.e., the I/O pins of the KGIC 210 and DUT 250 are to generate output signals, the signals to be generated from the output terminal D' is D'=A' EXCLUSIVE OR B'. The output signals generated from the output terminal D' is further received by an input terminal A" of a latch 270 which has another input terminal C" to receive the I/O indication via a fifth programmable delay means 275 and an output terminal B". The signal at the input terminal A" are latched to the output terminal B" during each time cycle when the input terminal C" has a value of one. The output value generated from the output terminal B" is the value in the input terminal A" in each time cycle when the value of C" is one, i.e., B"=A"=D'=A' EXCLUSIVE OR B'. The programmable delay means 275 is again used to accommodate processing speed variations to allow a suitable time tolerance between the outputs of the KGIC 210 and the DUT 250. A pass/fail signal is generated from the output terminal B" of the latch 270 which can be employed by a handler or a pass or fail light indicator (not shown) to further carry out the testing processes. The fifth programmable delay means 255, the I/O switching means 260, the comparator 265, the latch 270 and the programmable delay means 275 thus constitute an I/O test module 280 which can be employed for connecting to either the input pins, the output pins and the I/O pins to carry out the testing as described above. The programmable delay means 275 may not be required if timing tolerance is not important for the testing of DUT and KGIC.

Figure 5:
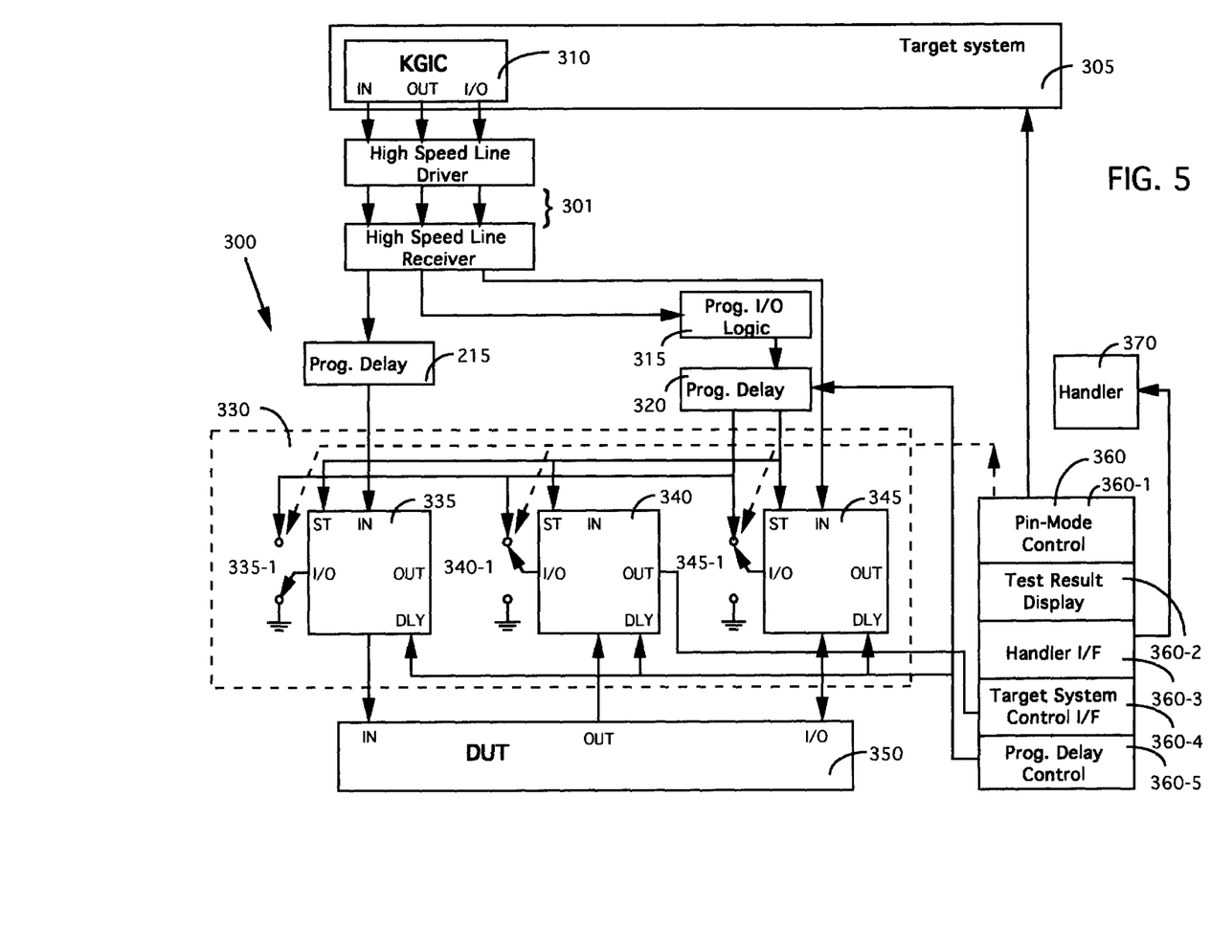
FIG. 5 is a functional block diagram of another preferred embodiment of an IC test system utilizing the input/output test module shown in FIG. 4 according to the present invention.

FIG. 5 shows another preferred embodiment of the present invention including an integrated circuit (IC) testing system 300 for testing a device under test (DUT) IC 350. The IC testing system 300 includes a target system interface means 301 which includes high speed line drivers, receivers, and transmission lines for connecting to a KGIC 310. The KGIC 310 is incorporated and operational on a target system 305. The KGIC 310 is identical to the DUT 350 wherein both have a set of input pins, i.e., IN, a set of output pins, i.e., OUT, and a set of input/output pins, I/O. The signal lines of the target system interface means 301 connecting to the input pins of KGIC 310 are connected to the input pins of the DUT 350 through a first I/O test module 335 which has a circuit structure and performs the same functions as that shown for the I/O test module 280 in FIG. 4. The signal lines connected to the output pins of KGIC 310 are connected to a second I/O test module 340 which also receives input signals from the output pins of the DUT 350 to perform the fail/pass comparisons as that described for the I/O test module 280 in FIG. 4.

The I/O pins of the KGIC 310 and the DUT 350 can either receive input signals or generate output signals. The output signals from specific output pins on the KGIC 310 and DUT 350 are to provide an indication for each machine cycle whether the I/O pins on the KGIC 310 and DUT 350 are to receive input signals or to generate output signals. The output signals from the output pins and I/O pins of the KGIC 310 are connected to a third I/O test module 345 via a programmable I/O control module 315 and a programmable delay means 320. The programmable I/O control module 315 can be programmed to provide an I/O indication for different chip designs. The I/O test modules 335, 340 and 345 are integrated into an integrated I/O test module 330. Under the control of a master control unit 360, the integrated I/O test module 330 provides test interface with the KGIC 310 incorporated in the target system 305 and the DUT 350. The master control unit 360 has a pin-mode control means 360-1 connected to a pin-mode control interface means 365 which is shown in dottedlines in FIG. 5 for controlling the pin-to-I/O test module input switching means 335-1, 340-1, and 345-1 for connecting the pins of the KGIC 310 to the input/output terminals on the I/O test modules 335, 340, and 345 respectively. For the input pins, the I/O control pin of the I/O test module 280 of FIG. 4 is connected to the ground. For the output pins, the I/O control pin of the I/O test module 280 is connected to VCC, i.e., logic one. For the I/O pins, the I/O control pin of the I/O test module 280 is connected to the output pin of programmable delay means 320. The master test control unit 360 further includes a test result display means 360-2 for displaying the test result, a module interface 360-3 for providing necessary interface signals to the I/O test modules 335, 340, and 345. The master test control unit 360 further includes a target system control means 360-4 for providing control signals to the target system 305, and a programmable delay control means 360-5 for providing delay signals to control the delay signals to the I/O test modules 335, 340 and 345 for timing adjustment of respective signals for allowable processing speed variations between the KGIC 310 and DUT 350. The test results processed by the master test control unit 360 are then utilized by the handler 370 to managed the DUT 350 according a pass/fail standard or different possibility of product handling processes depending on the test results generated by the master test control unit 360.

Figure 6:
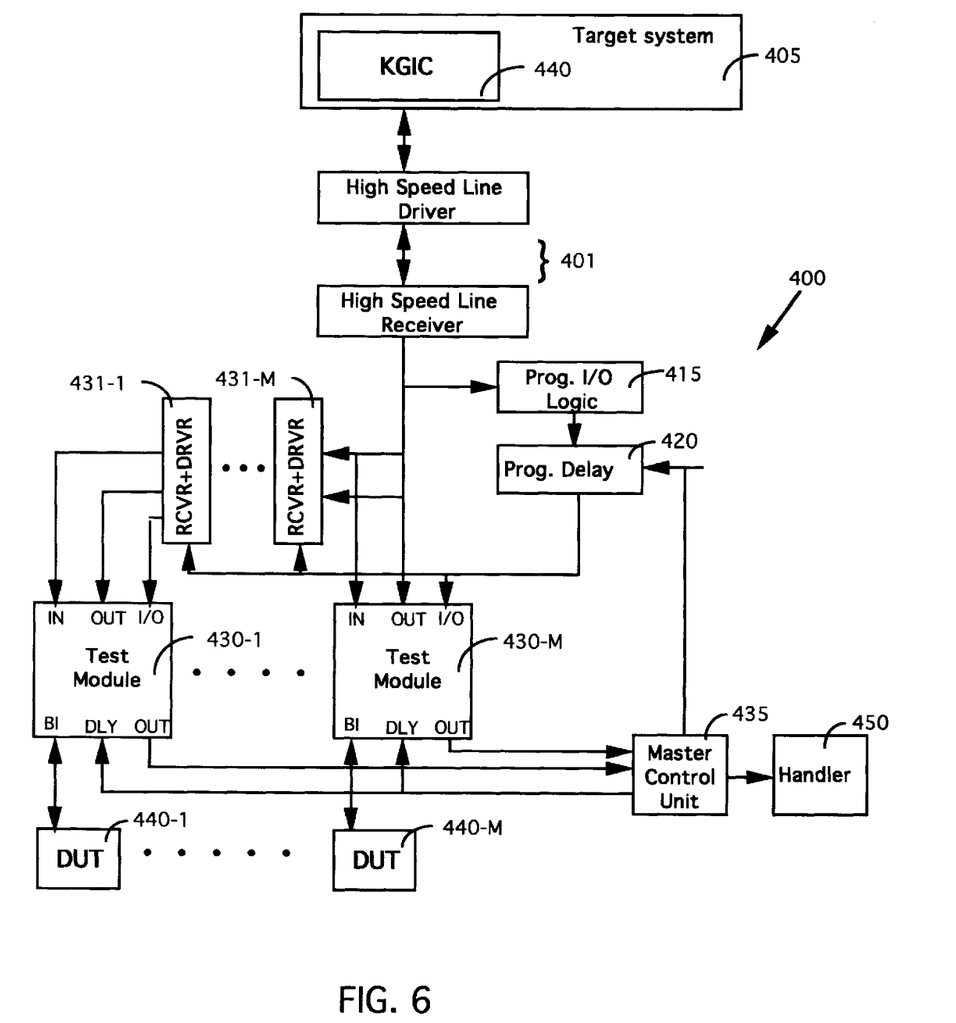
FIG. 6 is a functional block diagram of another preferred embodiment of an IC test system for simultaneously testing a plurality of DUT ICs according to the present invention.

FIG. 6 shows another IC testing system 400 according to the techniques disclosed in the present invention wherein the testing system 400 is used for simultaneously testing a plurality of DUT 440-1, 440-2, . . . , 440-M by comparing the output signals of a known-good IC 410 incorporated and operated on a target system 405 wherein the KGIC 410 is identical to the DUTs 440-1, 440-2, . . . , 440-M. The testing system 400 includes a target system interface system 401 which includes a high speed line driver, the high speed transmission lines, and the high speed line receivers, for connecting to the input, output, and I/O pins of the KGIC 410. For each DUT 440-1, 440-2, . . . , 440-M, the testing system 400 further includes an integrated I/O test module 430-1, 430-2, . . . , 430-M wherein each integrated I/O test module has same structure, interconnected by the interface 431-1 to 431-M which are the same as the interface 401, and performs the same functions as that of the integrated I/O test module 330 shown in FIG. 5. The testing system 400 further includes a master test control unit 435 to control the integrated I/O test modules 430-1, 430-2, . . . and 430-M and to provide input, output, and various control signals to the KGIC 410 and the DUTs 440-1, 440-2, . . . , 440-M similar to the functions provided by the master test control unit 360 of FIG. 5. Coupled between the target system interface 401, the I/O test modules 430-1, 430-2, . . . ,and 430-M, and the master test control unit are a programmable I/O logic means 415 to provide an I/O indication for the I/O pins and a programmable delay means 420 control by the master test control unit 435 to synchronize the machine cycles between the KGIC 410 and the DUTs 440-1, 440-2, . . . , 440-M. The master test control unit 435 generates the test results which are then received and processed by the handler 450 to process each DUT 440-1, 440-2, . . . , 440-M according the test results produced by the IC testing system 400.

Figure 7:
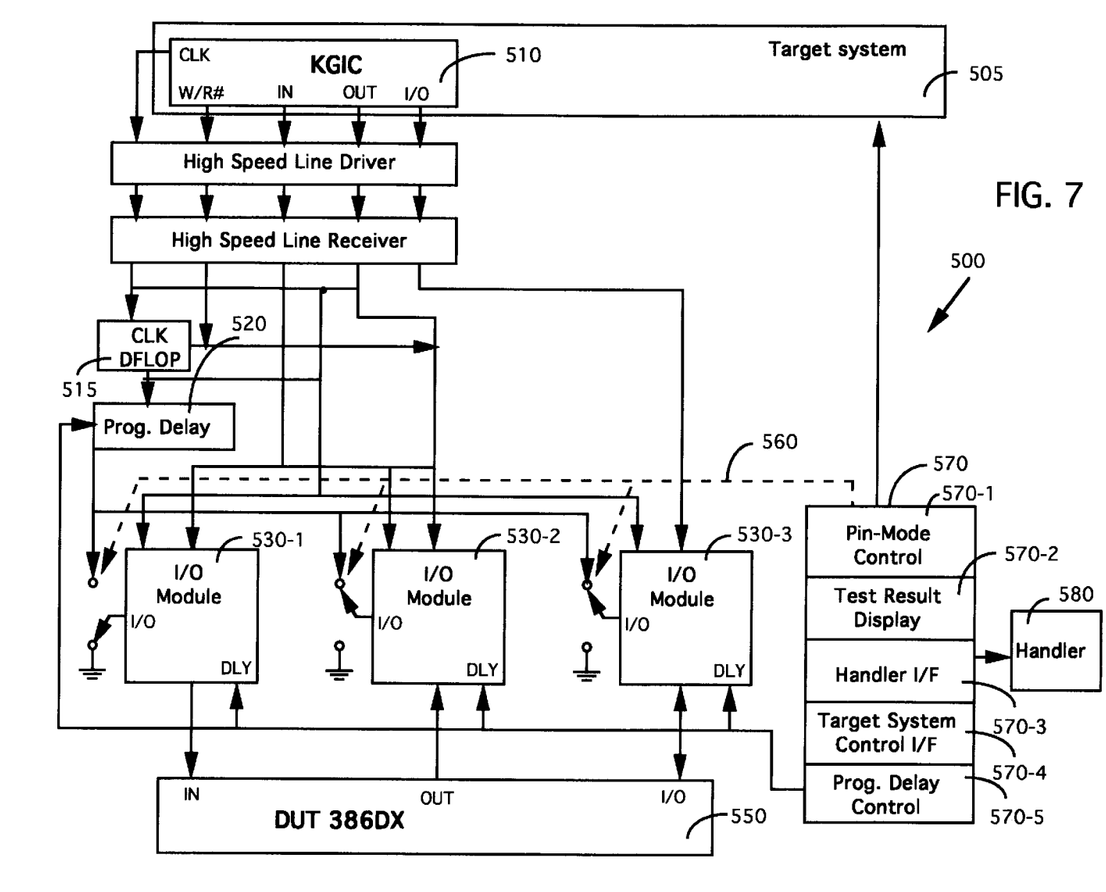
FIG. 7 is a functional block diagram for another preferred embodiment of an IC test system for testing an 386DX DUT IC according to the present invention.

FIG. 7 shows another preferred embodiment of the present invention wherein an IC testing system 500 is applied to test a DUT 550 which is a 386DX chip. The testing system 500 includes a target system interface means 501 which includes a set of five high speed signal lines 501-1 to 501-5, the high speed line driver and receiver for connecting to a KGIC 386DX chip 510 which is incorporated and operated in a target system, e.g., an IBM PC AT. The five signal lines 501-1 to 501-5 including signal line connected to the IN-pins, the OUT-pins, the I/O-pins, the CLK2-pins, and W/R#-pins, i.e., the write or read pins. Similar to the system configuration shown in FIG. 5, the testing system 500 includes three I/O test module 530-1 to 530-3 for coupling and testing the signals of the IN-pins, the OUT-pins, and I/O pins of the KGIC 386DX 510 and the DUT 386DX 550 respectively. The CLK2 pin and the W/R# pin are part of the output pins. The I/O test modules 530-1 to 530-3 receives the W/R# signals from the W/R#-pins of the KGIC 386DX chip 510 via the data line 501-4 synchronized by a DFLOP clk device 515 using the signals from CLK2 pin of the KGIC 386DX chip 510 through a programmable delay means 520. The I/O test modules 530-1 to 530-3 further are controlled by a master test control unit 570 which controls a pin-mode control interface means 560 (shown as the dotted control lines). The master test control unit 570 further includes a test result display 570-2, a handler interface 570-3 for controlling the handler 580. The master test control unit 570 further includes a target system control interface 570-4 for sending command to the target system 505, i.e., the IBM PC AT, and a programmable delay control means 570-5 for controlling the time delays of the I/O test modules 5301 to 530-3 to achieve machine cycle synchronization and for accommodating processing speed variations between the KGIC 510 and the DUT within each clock cycle. Under the control of the master control unit 570, the input signals inputted to the input pins and the I/O pins of the KGIC 386DX 510 are applied, via the I/O test modules 530-1 to 530-3, to the corresponding input pins of the DUT 386DX 550. The output signals generated from the output pins and the I/O pins of the KGIC 510 are then compared to the output signals generated from the corresponding output pins of the DUT 550. The IC testing upon the DUT 550 can be performed on the fly without requiring first generating a fix set of testing stimuli.

The present invention thus provides an IC testing technique and system configuration which is able to overcome the difficulties encountered in the prior art Specifically, it provides an IC testing technique and system configuration wherein generation and storage of the testing pattern signals as input testing stimuli are no longer required for conducting the IC tests. The present invention also provides a new IC testing technique and system configuration wherein high speed IC tests can be performed with simple system configuration so that the tests can be economically performed with very simple and low cost test equipments. The system configuration as disclosed in the present invention does not require sophisticate hardware or software methods for controlling the exact timing in inputting testing pattern signals and collecting a response signals for comparisons for fault detection. The new IC testing technique and system configuration disclosed in this invention also allow very flexible arrangement of testing sequences and testing configurations without being limited by different types of simulation analyses required in the conventional testing methods.

Although the present invention has been described in terms of the presently preferred embodiment, it is to be understood that such disclosure is not to be interpreted as limiting. Various alternations and modifications will no doubt become apparent to those skilled in the art after reading the above disclosure. Accordingly, it is intended that the appended claims be interpreted as covering all alternations and modifications as fall within the true spirit and scope of the invention.

I claim:

1. An on-the-fly integrated circuit (IC) testing system for testing a device under test (DUT) IC by employing a known-good IC (KGIC), said IC testing system comprising:
    a target system incorporating said known-good IC (KGIC) therein wherein said target system engaging said KGIC as an integrated part of said target system for executing a testing program for directly generating a plurality of spontaneous target system generated input signals to said KGIC and as a result of executing said testing program said KGIC further generating a plurality of spontaneous known-good output signals in response to said spontaneous target system generated input signals;
    an input signal transmitting means for transmitting said spontaneous target system generated input signals which are inputted to said KGIC as spontaneous target system generated test stimuli to said DUT IC for generating a plurality of spontaneous test output signals; and
    an output signal processing means for receiving and processing said spontaneous known-good output signals and said spontaneous test output signals for determining testing results therefrom whereby said DUT IC is tested with said spontaneous target system generated test stimuli without being limited by a finite number of priorly planned and generated test patterns as test stimuli.

2. The IC testing system of claim 1 further comprises:
    a control means for controlling the timing of said spontaneous target system generated test stimuli, said spontaneous known-good output signals, and said spontaneous test output signals.

3. The IC testing system of claim 1 wherein:
    said output signal processing means further includes an output signal synchronizing means for synchronizing said test output signals with said known-good output signals.

4. The IC testing system of claim 3 wherein:
    said input data transmitting means further includes a transmitting-time control means for controlling the timing of transmitting said spontaneous target system generated test stimuli from said target system to said DUT IC.

5. An on-the-fly integrated circuit (IC) testing system for testing a device under test (DUT) IC by employing a known-good IC (KGIC) identical to said DUT, said testing system comprising:
    a target system incorporating said known-good IC (KGIC) therein wherein said target system engaging said KGIC as an integrated part of said taret system for executing a diagnostic program thereon for directly generating a plurality of spontaneous target system generated diagnostic input signals to said KGIC wherein said KGIC further generating a plurality of spontaneous known-good diagnostic output signals in response to said spontaneous target system generated diagnostic input signals;
    an input signal transmitting means for transmitting said spontaneous target system generated diagnostic input signals as spontaneous target system generated diagnostic test stimuli to said DUT IC for generating a plurality of spontaneous test output signals; and
    an output signal processing means for receiving and processing said spontaneous known-good diagnostic output signals and said spontaneous test output signals for determining testing results therefrom whereby said DUT IC is tested with said spontaneous target system generated diagnostic stimuli without being limited by a finite number of priorly planned and generated test patterns as diagnostic test stimuli.

6. The IC testing system of claim 5 wherein:
    said target system is an electronic system and said known-good IC and said DUT IC are ICs which are targeted to be engaged by said electronic system for executing said diagnostic program with said KGIC included as part of an integrated target system.

7. The IC testing system of claim 6 wherein:
    said diagnostic program executed on said target system is employed for performing a plurality of real time on-the-fly diagnostic tests on said DUT IC by applying said spontaneous target system generated diagnostic input signals.

8. An on-the-fly testing system for testing a device under test (DUT) by employing a known-good-device (KGD) identical to said DUT, said testing system comprising:
    a target system incorporating said KGD therein wherein said target system engaging said KGD as an integrated part of said target system for executing a testing sequence for directly generating a plurality of spontaneous target system generated input signals to said KGD wherein said KGD further generating a plurality of spontaneous known-good output signals in response to said spontaneous target system generated input signals;

an input signal transmitting means for transmitting said plurality of spontaneous target system generated input signals which are inputted to said KGD as spontaneous target system generated test stimuli signals to said DUT for generating a plurality of spontaneous test output signals; and an output signal processing means for receiving and processing said spontaneous known-good output signals and said spontaneous test output signals for determining testing results therefrom whereby said DUT is tested with said spontaneous target system generated test stimuli without being limited by a finite number of priorly planned and generated test patterns as test stimuli.

9. The testing system of claim 8 further comprises:

a control means for controlling the timing of said spontaneous target system generated diagnostic test stimuli signals, said spontaneous known-good output signals, and said spontaneous test output signals.

10. A method for performing an on-the-fly test for a device-under-test (DUT) integrated circuit (IC) comprising the steps of:

(a) incorporating a known-good IC (KGIC), identical to said DUT IC, in a targe system and engaging said KGIC as an integrated part of said taret system for executing a program thereon for generating and inputting a plurality of spontaneous target system generated input signals to said KGIC and generating a plurality of known-good spontaneous output signals in response to said spontaneous target system generated input signals;

(b) transmitting said spontaneous target system generated input signals generated by said target system from executing said program as spontaneous target system generated test stimuli for inputting to said DUT IC for generating a plurality of spontaneous test output signals; and (c) receiving and processing said known-good spontaneous output signals and said spontaneous test output signals for determining test results therefrom whereby said DUT IC is tested with said spontaneous target system generated test stimuli without being limited by a finite number of priorly planned and generated test patterns as test stimuli.

11. An integrated circuit (IC) test-stimuli generation system comprising:

a target system incorporating a known-good IC (KGIC) for engaging said KGIC as an integrated part of said target system for executing a testing program for directly generating a plurality of target system generated input signals for inputting to said KGIC; and a test-stimuli signal transmitting means electrically communicated with said KGIC for extracting said target system generated input signals for inputting said KGIC as a plurality of spontaneous IC testing stimuli signals.

12. The spontaneous IC testing-signal generation system of claim 11 further comprising:

a test verification signal transmitting means electrically communicated with said KGIC for extracting a plurality of KGIC output signals generated in response to said spontaneous target system generated input signals inputted to said KGIC whereby said KGIC output signals are available for test verification.

* * * * *